United States Patent [19]

Akhtar et al.

[11] Patent Number: 4,873,119
[45] Date of Patent: Oct. 10, 1989

[54] CATALYTIC DEPOSITION OF SEMICONDUCTORS

[75] Inventors: Masud Akhtar, Lawrenceville; Herbert A. Weakliem, Pennington, both of N.J.

[73] Assignee: Chronar Corp., Princeton, N.J.

[21] Appl. No.: 937,032

[22] Filed: Jan. 28, 1987

[51] Int. Cl.[4] .............................................. B05D 3/06
[52] U.S. Cl. ..................................... 427/39; 427/45.1; 427/58; 437/173
[58] Field of Search .......................... 427/39, 45.1, 58; 437/173

[56] References Cited

U.S. PATENT DOCUMENTS 4,532,199  7/1985  Cleno et al. ...................... 427/39 X Primary Examiner—Bernard Pianalto
Attorney, Agent, or Firm—George E. Kersey

[57] ABSTRACT

The invention provides a method for preparing amorphous semiconductors by (a) activating a semiconductane gas using a activator to produce mononuclear, reactive fragments or gaseous condensation products which serve as precursors for the deposition of an amorphous semiconductor; and (b) controlling the temperature of the activator and the flow rate and temperature of the semiconductane gas so that it does not completely decompose upon the activator.

5 Claims, 4 Drawing Sheets

CATALYTIC DEPOSITION OF SEMICONDUCTORS

BACKGROUND OF THE INVENTION

This invention relates to the deposition of semiconductors, and, more particularly, to the deposition of amorphous semiconductors.

In the production of amorphous semiconductors, it is common practice to decompose chemical substances known as semiconductanes. The most common semiconductanes are silanes and germanes, which are hydrogenated compounds of silicon and germanium. When the silanes have polysilicon atoms, i.e. include more than one silicon atom, they are known as polysilanes. Similarly, germanes with polygermanium atoms are known as polygermanes.

Standard deposition procedures involve glow discharge and pyrolytic conversion of semiconductane gases. It is desirable to accomplish such conversions at comparatively low temperatures and high rates.

Accordingly, it is an object of the invention to facilitate the conversion of semiconductanes to amorphous semiconductors.

A related object is to achieve the conversion at a comparatively lower temperature than in the prior art.

Another related object is to achieve the conversion at a comparatively higher rate than in the prior art.

SUMMARY OF THE INVENTION

In accomplishing the foregoing and related objects, the invention provides a method and apparatus for preparing amorphous semiconductors by (a) activating a semiconductane gas using an activator to produce mononuclear, reactive fragments or gaseous condensation products which serve as precursors for the deposition of an amorphous semiconductor; and (b) controlling the temperature of the activator and the flow rate and temperature of the semiconductane gas so that it does not completely decompose upon the activator.

The activator is a catalytic member that brings about the production of the precursors without itself becoming affected thereby. The activation products are decomposed by at least one of (a) glow discharge, (b) heat, including pyrolysis, or (c) light, including ultraviolet, visible and infrared produced by a high intensity source, such as a laser, and further assisted by heat if required. The heating effect is in the range from about 150° C. to about 600° C. in order to produce an amorphous semiconductor, and from about 600° C. to about 1200° C. to produce a microcrystalline or crystalline semiconductor. When the decomposition is by glow discharge or light, it can be further assisted by heat in the temperature range from about 100° C. to 600° C. The preparation is at a pressure in the range from about 0.1 Torr to about 760 Torr (one atmosphere).

In accordance with one aspect of the invention, the activator is a heated component selected from the class the of precious metals such as platinum and rhodium; high work function metals such as tungsten, chromium, or nickel; metallic alloys such as nichrome or hastelloy; and salts of precious and other metals. The heated component is advantageously an electrically heated filament.

In accordance with a further aspect of the invention, the catalytic member is mercury vapor in the presence of atomic hydrogen obtained by subjecting the mercury vapor and hydrogen to electrical energization, including the action of microwaves and other types of glow discharge.

In accordance with yet another aspect of the invention, the semiconductane gas is selected from the class consisting of alkyl and aryl silanes and germanes, including germanium and silicon hydrides. Other gaseous phase additives can be included such as n-type and p-type dopants.

DESCRIPTION OF THE DRAWINGS

Other aspects of the invention will become apparent after considering several illustrative embodiments, taken in conjunction with the drawings, in which.

DETAILED DESCRIPTION

Figure 1:
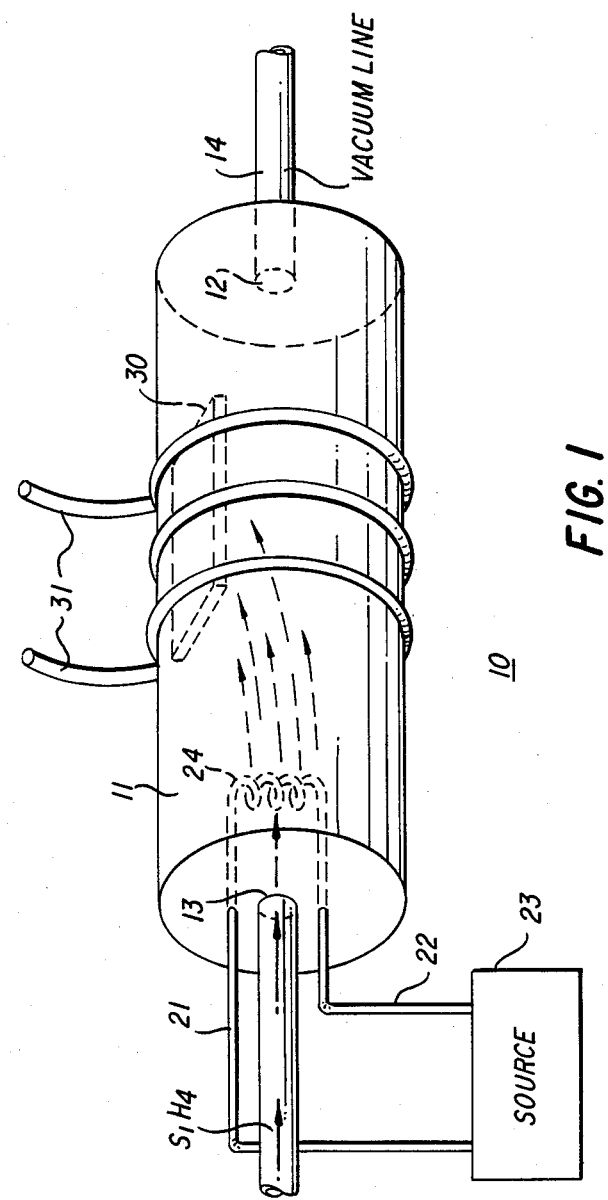
FIG. 1 is a schematic view of a deposition system in accordance with the invention.

With reference to the drawings, FIG. 1 shows a deposition system 10 in accordance with the invention. A quartz tube 11 has one end 12 connected to a vacuum line 14 and the opposite end 13 has an activator element 20 with two leads 21 and 22. The element 20 is heated electrically by current from a source 23. In the particular case of FIG. 1, the activator element 20 is a tungsten wire or filament 24. Between the leads 21 and 22 is a gas inlet 14 where, for example, silane ($SiH_4$) is passed at an illustrative flow rate of about 50 SCCM (Standard Cubic Centimeters per Minute) and total pressure of about 20 Torr.

When the filament 24 reaches a temperature of about 500° C., decomposition fragments of the silane gas fly away from the filament 23 and collect on a substrate 30 placed near the hot surfaces of the tube 11.

The substrate 30 has a temperature of about 300° C. and it is heated from outside the tube 11 by, for example, a resistance heating element 31. As a result, an amorphous film of hydrogenated silicon forms on the substrate 30.

Figure 2:
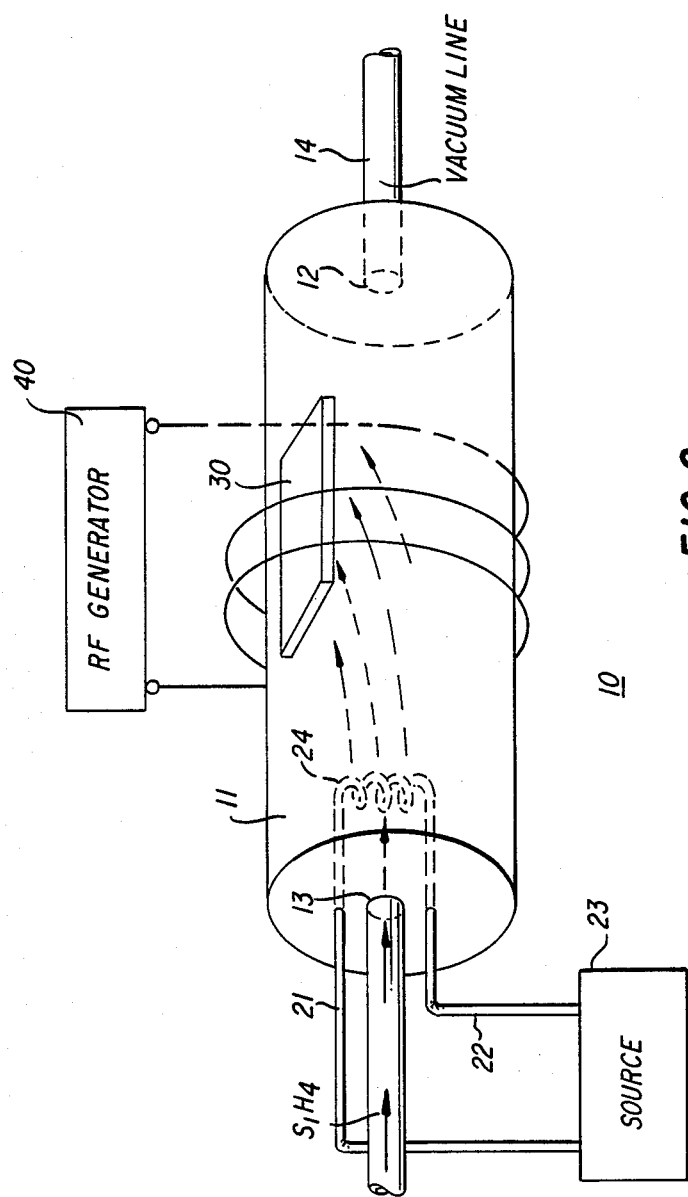
FIG. 2 is a schematic view of an alternative deposition system.

This procedure is to be contrasted with the normal CVD and other depositions where, although hydrogenated silicon is produced, it is necessary to use a much higher temperature to get the same quality of hydrogenated amorphous silicon. The quality of the hydrogenated amorphous silicon obtained in this case is superior to what is otherwise obtained A further embodiment is shown in FIG. 2 with generally the same apparatus as FIG. 1 except that the substrate 30 is enclosed between an RF generator 40. In this case, hydrogenated amorphous silicon is obtained around 100° C. This is a glow discharge technique which is superior to conventional glow discharge. Since the apparatus of FIG. 2 uses glow discharge, it is not necessary to separately heat the substrate 30. However, it may be desirable to do so.

Figure 3:
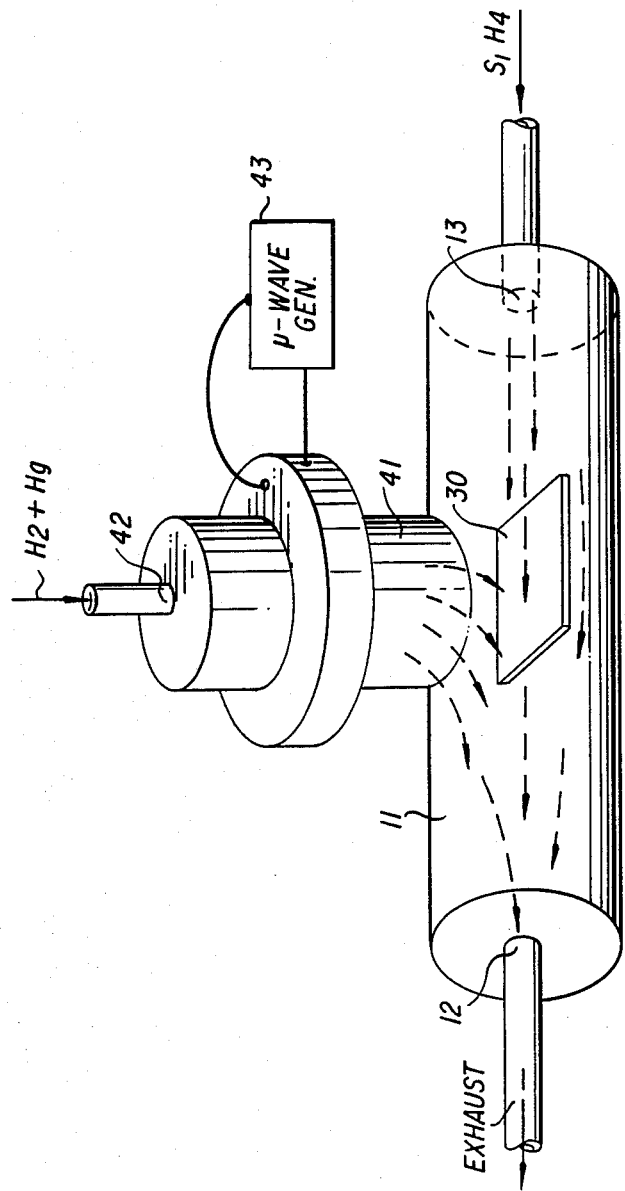
FIG. 3 is a schematic view of an alternative deposition system.

Still another embodiment is shown in FIG. 3. Again, a quartz tube 11 is used and is open at both ends 12 and 13. About the middle 14 of the tube 11 and perpendicular to its longitudinal axis there is a T-joint with a second tube 41. The two tubes 11 and 41 form a cross. On the right side 12 of the horizontal tube 11, a monosemiconductane is applied and exhausted horizontally through the left side 13. In the vertical tube 41, mercury vapor and hydrogen gas are introduced. Next to the mercury inlet 42 is a microwave cavity 43 surrounding the quartz tube. Following the microwave discharge, mercury is activated and atomic hydrogen formed which impinges upon the semiconductane gas in the tube 11. Below the mercury inlet a substrate 30 is placed at the approximate intersection of the monosemiconductane stream and the activated mercury stream with atomic hydrogen. The pressure of the hydrogen gas is greater than that of the silane. The approximate pressures are 1 Torr of silane and 2 Torr of hydrogen. The mercury is carried by the hydrogen gas so that its slight pressure does not significantly add to the pressure of hydrogen.

Figure 4:
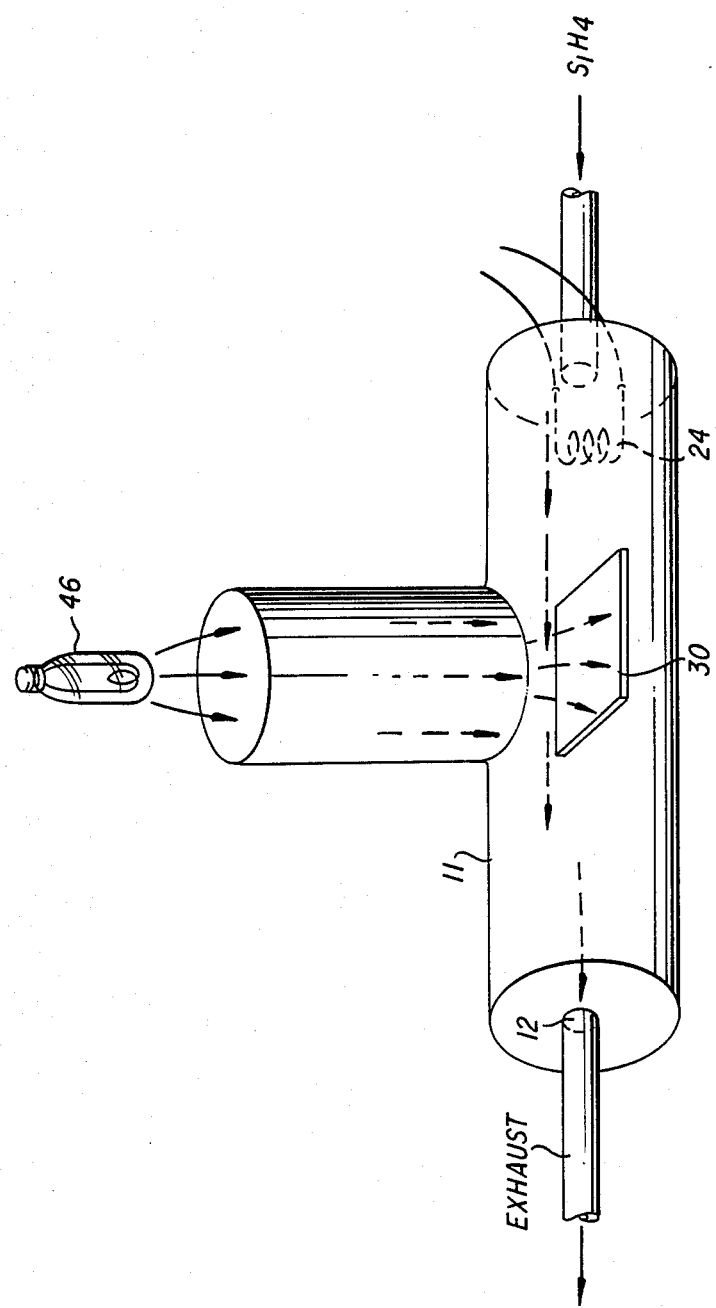
FIG. 4 is a schematic view of an alternative deposition system.

Still another embodiment is shown in FIG. 4 which is similar to that of FIG. 3 with cross arms, and, like FIG. 1, includes a monosemiconductane inlet. The opposite side goes to a vacuum and includes the activator which straddles the feed-through line. The vertical line 41 has a window 45 of quartz. The top of the window 45 is exposed to a light source 46. The light source 46 decomposes the active fragments formed by the activator filament 24 and decomposes the silane at a substrate 30 located at the intersection of the two tubes. In this example, the second tube merely intersects the first tube in a T-structure.

The advantage of the foregoing systems is that amorphous silicon can be produced at higher deposition rates and at lower temperatures and pressures than by conventional techniques. For each class of silicon or germanium, higher rates, lower temperatures, and lower pressures can be used in corresponding other processes.

What is claimed is:

1. A method of preparing amorphous semiconductors comprising the steps of:
   (a) activating a semiconductane gas, including the hydrides of polyvalent elements, using an activator to produce mononuclear, reactive fragments and gaseous condensation products which serve as precursors for the deposition of an amorphous semicounductor; and
   (b) controlling the temperature of the activator and the flow rate of the semiconductane gas so that it does not decompose upon the activator;
   wherein the activator is a catalytic member, comprising an electrically heated metal wire coil, which serves to excite a semiconductane gas and bring about the production of precursors without becoming affected thereby.

2. A method of preparing amorphous semiconductors comprising the steps of:
   (a) activating a semiconductane gas, including the hydrides of polyvalent elements, using an activator to produce mononuclear, reactive fragments and gaseous condensation products which serve as precursors for the deposition of an amorphous semiconductor; and
   (b) controlling the temperature of the activator and the flow rate of the semiconductane gase so that it does not decompose upon the activator;
   wherein the activation products are thereafter decomposed by at least one of (a) glow discharge, (b) heat, including pyrolysis, (c) light, including ultraviolet, visible and infrared a produced by a high intensity source, including laser and fruther assisted by heat if required;
   and further wherein the excited or partially reacted gas is further decomposed by glow discharge or light and is further decomposed by glow discharge or light and is further assisted by heat in the temperature range of about 100° C. to about 600° C.

3. A method of preparing amorphous semiconductors comprising the steps of:
   (a) activating a semiconductane gas, including the hydrides of polyvalent elements, using an activator to produce mononuclear, reactive fragments and gaseous condensation products which serve as precursors for the deposition of an amorphous semiconductor; and
   (b) controlling the temperature of the actvator and the flow rate of he semiconductane gas so that it does not decompose upon the activator;
   wherein the activator is a heat component selected from the Class of precious metals such as platinum an rodium; metals such as tungston, chromium or nickel; talic alloys such as nichrome or hastelloy; and salts of precious and other metals.

4. The method of claim 3 wherein said heated component is an electrically heated filament.

5. A method of preparing amorphous semiconductors comprising the steps of:
   (a) activating a semiconductane gas, including the hydrides of polyvalent elements, using an activator to produce mononuclear, reactive fragments and gaseous condensiation products which serve as precursors for the deposition of an amorphous semiconductor; and
   (b) controlling the temperature of the activator and the flow rate of the semiconductane gas so that it does not decompose upon the activator;
   wherein activation of the of the activator is by mercury in the presence of atomic hydrogen obtained by subjecting the mercury vapor and hydrogen to electrical energization, including the action of microwaves and other type of glow discharge.

* * * * *